(12) United States Patent
Bellantoni

(10) Patent No.: US 8,391,811 B2
(45) Date of Patent: Mar. 5, 2013

(54) INPUT-POWER OVERLOAD-PROTECTION CIRCUIT

(75) Inventor: John Bellantoni, San Jose, CA (US)

(73) Assignee: Triquint Semiconductor, Inc., Hillsboro, OR (US)

(*) Notice: Subject to any disclaimer, the term of this patent is extended or adjusted under 35 U.S.C. 154(b) by 605 days.

(21) Appl. No.: 12/650,403

(22) Filed: Dec. 30, 2009

(65) Prior Publication Data
US 2011/0156834 A1 Jun. 30, 2011

(51) Int. Cl.
*H01Q 11/12* (2006.01)
*H04B 1/04* (2006.01)
(52) U.S. Cl. ............... 455/117; 455/127.2; 455/129
(58) Field of Classification Search ............... 455/117, 455/127.1, 127.2, 129
See application file for complete search history.

(56) References Cited

U.S. PATENT DOCUMENTS

| | | |
|---|---|---|
| 4,488,122 A | 12/1984 | Wolkstein |
| 4,564,816 A | 1/1986 | Kumar et al. |
| 4,588,958 A | 5/1986 | Katz et al. |
| 4,882,547 A | 11/1989 | Katz |
| 5,038,113 A | 8/1991 | Katz et al. |
| 5,138,275 A | 8/1992 | Abbiati et al. |
| 5,162,748 A | 11/1992 | Katz |
| 5,191,338 A | 3/1993 | Katz et al. |
| 5,300,900 A | 4/1994 | Bellantoni |
| 5,678,209 A * | 10/1997 | Strakovsky .............. 455/126 |
| 6,104,919 A * | 8/2000 | Lyall et al. .............. 455/249.1 |
| 7,418,237 B2 * | 8/2008 | Klemetti .............. 455/41.1 |
| 7,460,847 B2 * | 12/2008 | Hendrix et al. .............. 455/212 |
| 7,873,334 B2 * | 1/2011 | Itkin et al. .............. 455/126 |

OTHER PUBLICATIONS

Irfan Ibrahim and Holger Heuermann, EDGE Power Amplifier ACPR Improvement with Inter-Stage Pre- and Postdistortion Linearization, German Microwave Conference, Mar. 10-12, 2008, pp. 42-45.
Ka Tsun Mok, Wing Shing Chan, Chun Kai Leung, Chi Sun Yu, and Chung Wai Li, Broadband Characteristics of a Parallel Diode Linearized Amplifier, Microwave and Optical Technologies Letters/vol. 36, No. 2, Jan. 20 2003, pp. 82-83.

* cited by examiner

*Primary Examiner* — Nhan Le
(74) *Attorney, Agent, or Firm* — Schwabe Williamson & Wyatt

(57) ABSTRACT

Embodiments of circuits, apparatuses, and systems for a protection circuit having a control element with an attenuation state to protect against overload conditions. Other embodiments may be described and claimed.

14 Claims, 7 Drawing Sheets

INPUT-POWER OVERLOAD-PROTECTION CIRCUIT

FIELD

Embodiments of the present disclosure relate generally to the field of circuits, and more particularly to an input-power overload-protection circuit.

BACKGROUND

Power amplifiers may experience significant damage under input-power overload conditions. Protection against such overload conditions is complicated by complex digitally modulated signals with high peak-to-average ratios, such as those found in wireless code division multiple access (W-CDMA) systems. The high peak-to-average ratios create fast rise and fall times of a radio frequency (RF) waveform in the time domain. Conventional electronic protection systems fail to react quickly enough to avoid permanent damage from the peaks of the RF waveform, while at the same time providing linearity sufficient to not degrade spectral re-growth.

BRIEF DESCRIPTION OF THE DRAWINGS

Embodiments are illustrated by way of example and not by way of limitation in the figures of the accompanying drawings, in which like references indicate similar elements and in which:

FIG. 4 is a graph illustrating a ratio of power-out to power-in;

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Figure 1:
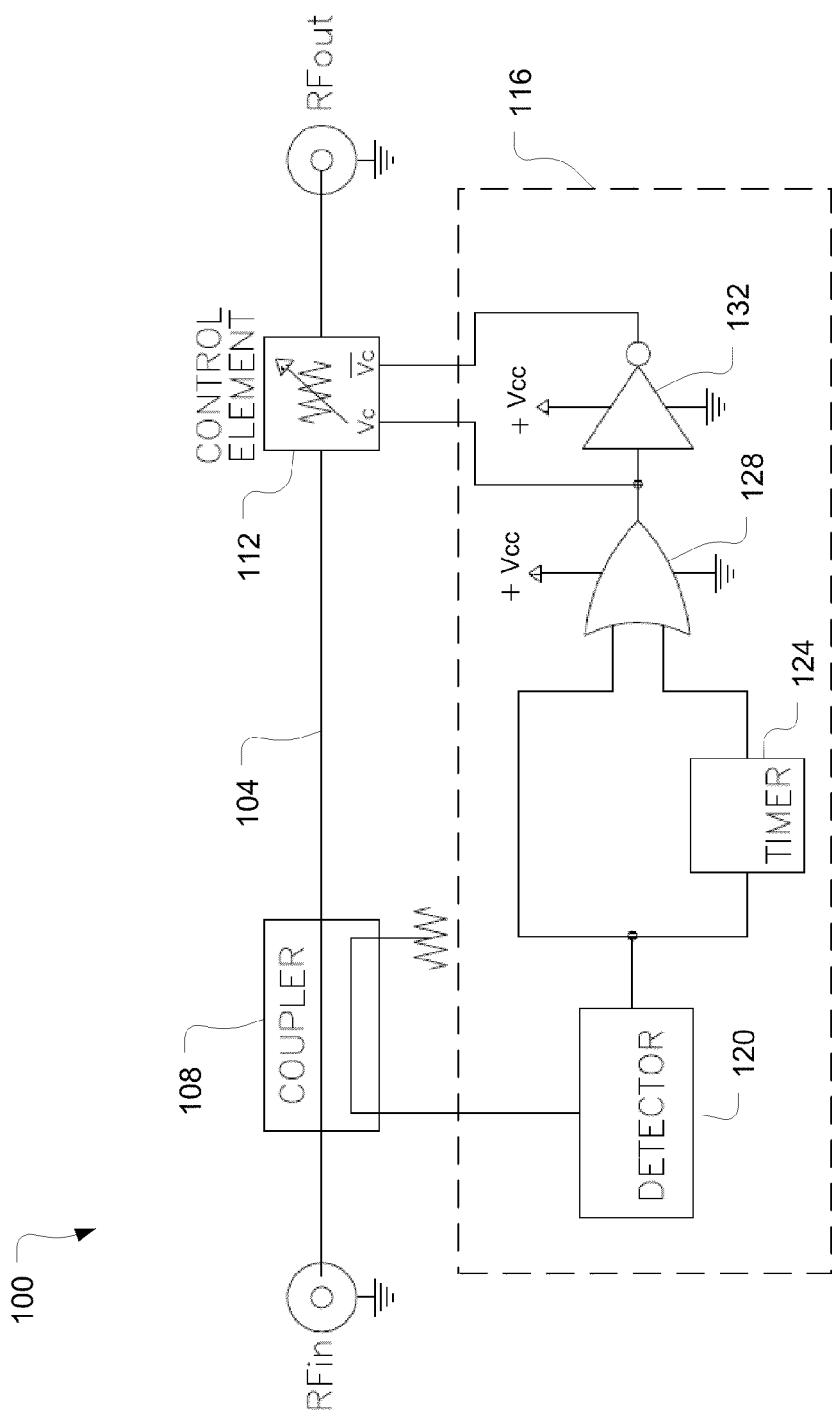
FIG. 1 illustrates an input-power overload-protection circuit.

FIG. 1 illustrates an input-power overload-protection circuit 100 including a transmission line 104 having a coupler 108 and a control element 112 coupled therewith in accordance with some embodiments. The input-power overload-protection circuit 100 (hereinafter "circuit 100") may further include a protection module 116 coupled with both the coupler 108 and the control element 112.

The protection module 116 may include a detector 120 that, along with other components of the protection module 116, is physically separated from the transmission line 104. The detector 120 may have an output coupled with a timer 124, e.g., a one-shot timer, and a first input of an OR logic element 128. A second input of the OR logic element 128 may be coupled with an output of the timer 124. An output of the OR logic element 128 may be provided to the control element 112 and an input of an inverter 132. An output of the inverter 132 may also be coupled with the control element 112. The OR logic element 128 and the inverter 132 (collectively referred to as "the logic elements") may both be supplied with a bias voltage Vcc at respective power supply inputs.

Figure 2:
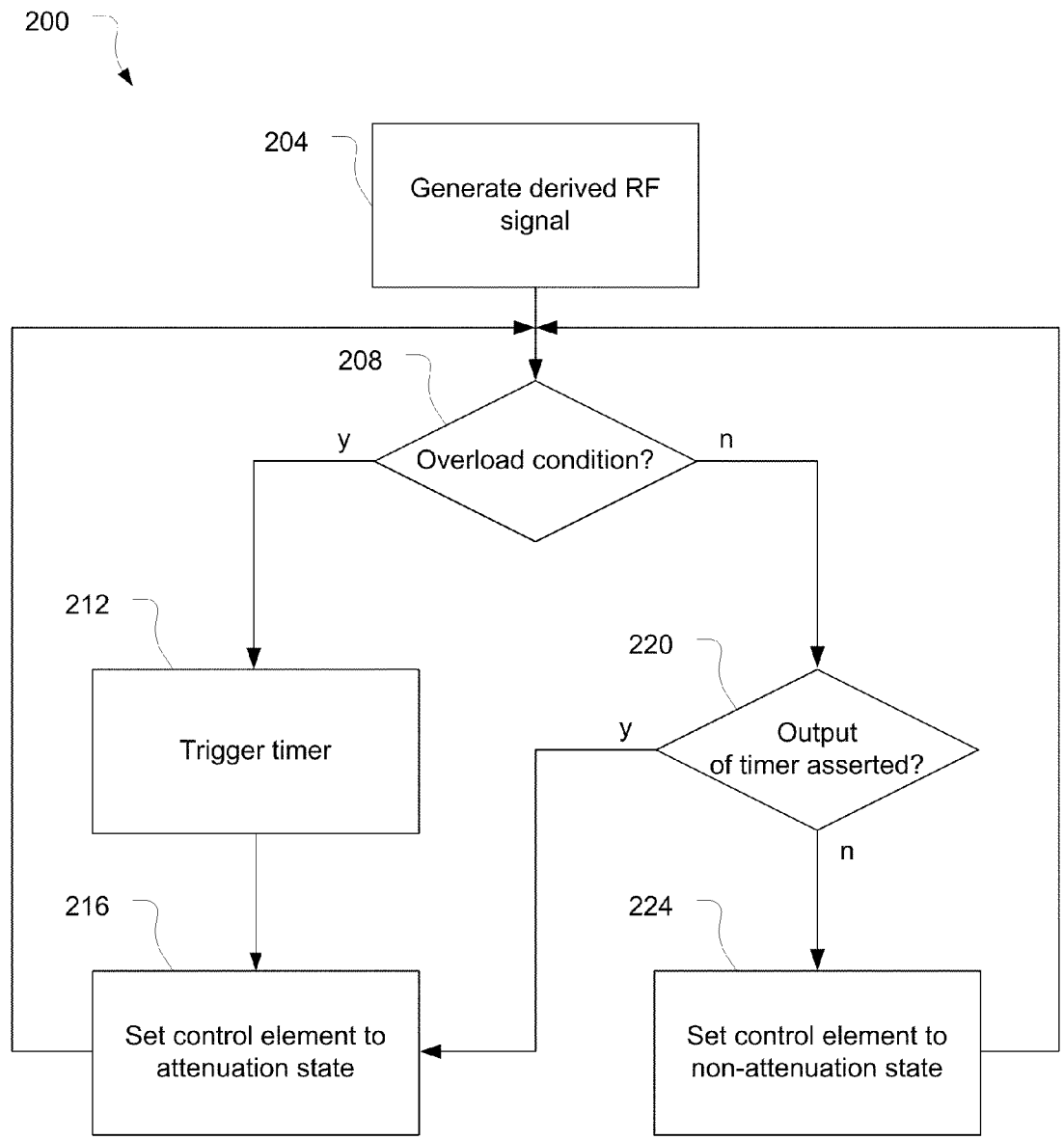
FIG. 2 is a flowchart depicting operation of the input-power overload-protection circuit.

Operation of the circuit 100 may be described with additional reference to a flowchart 200 depicted in FIG. 2. At block 204, the coupler 108 may generate a derived RF signal based on an input RF signal, RFin, that is transmitted on the transmission line 104. The derived RF signal may be equal, or proportional, to RFin. The coupler 108 may provide the derived RF signal to detector 120 of the protection module 116.

At block 208, the detector 120 may detect for an overload condition of RFin. Detection of an overload condition may be accomplished by comparing a value of the derived RF signal to a predetermined threshold value. The predetermined threshold value may be set such that an overload condition is indicated if the derived RF signal is above the threshold. Other comparative functions may be used in other embodiments.

If an overload condition is detected at block 208, the detector 120 may assert a signal at its output. This may trigger the timer 124 at block 212, and it may also trigger the logic elements to set the control element 112 to an attenuation state at block 216. The asserted signal of the detector 120 may trigger the logic elements by being provided directly to the OR logic element 128. The OR logic element 128, having an asserted signal on at least one of its inputs, may have an asserted signal of Vcc at its output. This asserted signal may then be directly provided to a Vc input of the control element 112, which may result in the control element 112 attenuating the RFin signal by reflecting at least a portion of the RFin signal back toward the input. Providing an asserted signal to the Vc input of the control element 112 may represent a forward biasing of the control element 112 in some embodiments.

If, at block 208, it is determined that an overload condition is not detected, it may be determined whether the output of the timer 124 is asserted at block 220. In one embodiment, the determination at block 208 and the determination of block 220 may be done substantially simultaneously by the OR logic element 128. An asserted output of the timer 124 may trigger the logic elements to set control element 112 to the attenuation state at block 216 as described above.

If, at block 220, it is determined that the output signal of the timer 124 is not asserted, then the logic elements may set the control element 112 to a non-attenuation state at block 224. The non-attenuation state may result from both of the signals on the inputs of the OR logic element 128 being de-asserted. This may cause the output of the OR logic element 128 to be de-asserted and the output of the inverter 132 to be asserted as Vcc. The asserted output of the inverter 132 may be provided to a $\overline{Vc}$ input of the control element 112, resulting in the control element 112 allowing the RFin signal to pass through largely unaffected. Providing an asserted signal to the $\overline{Vc}$ input of the control element 112 may represent a reverse biasing of the control element 112 in some embodiments.

In such a manner, the protection module 116 may decouple the detection function by using the derived RF signal as opposed to the RFin signal on the transmission line 104. Furthermore, the output of the detector 120 being provided directly to the OR logic element 128 may provide a rapid response to an initial occurrence of an overload condition, while the use of the timer 124 may provide a hold function between peaks of subsequent RF pulses so that the protection module 116 does not toggle the attenuation states of the control element 112 more frequently than desired. This hold function may allow for a more fully developed attenuation response from the control element 112.

In some embodiments, the control element 112 may consist solely of a diode or a field effect transistor (FET) that, in addition to providing the attenuation discussed above, also pre-distorts the RFin signal to increase a linear response of a power amplifier coupled with the circuit 100. This pre-distortion linearization may be done when the control element 112 is in the non-attenuation state. Using one element, e.g., a diode or a FET, to both attenuate and pre-distort the RFin signal may be associated with less insertion loss, and more overall gain, than using different elements for each of the attenuation and pre-distortion functions.

Figure 3:
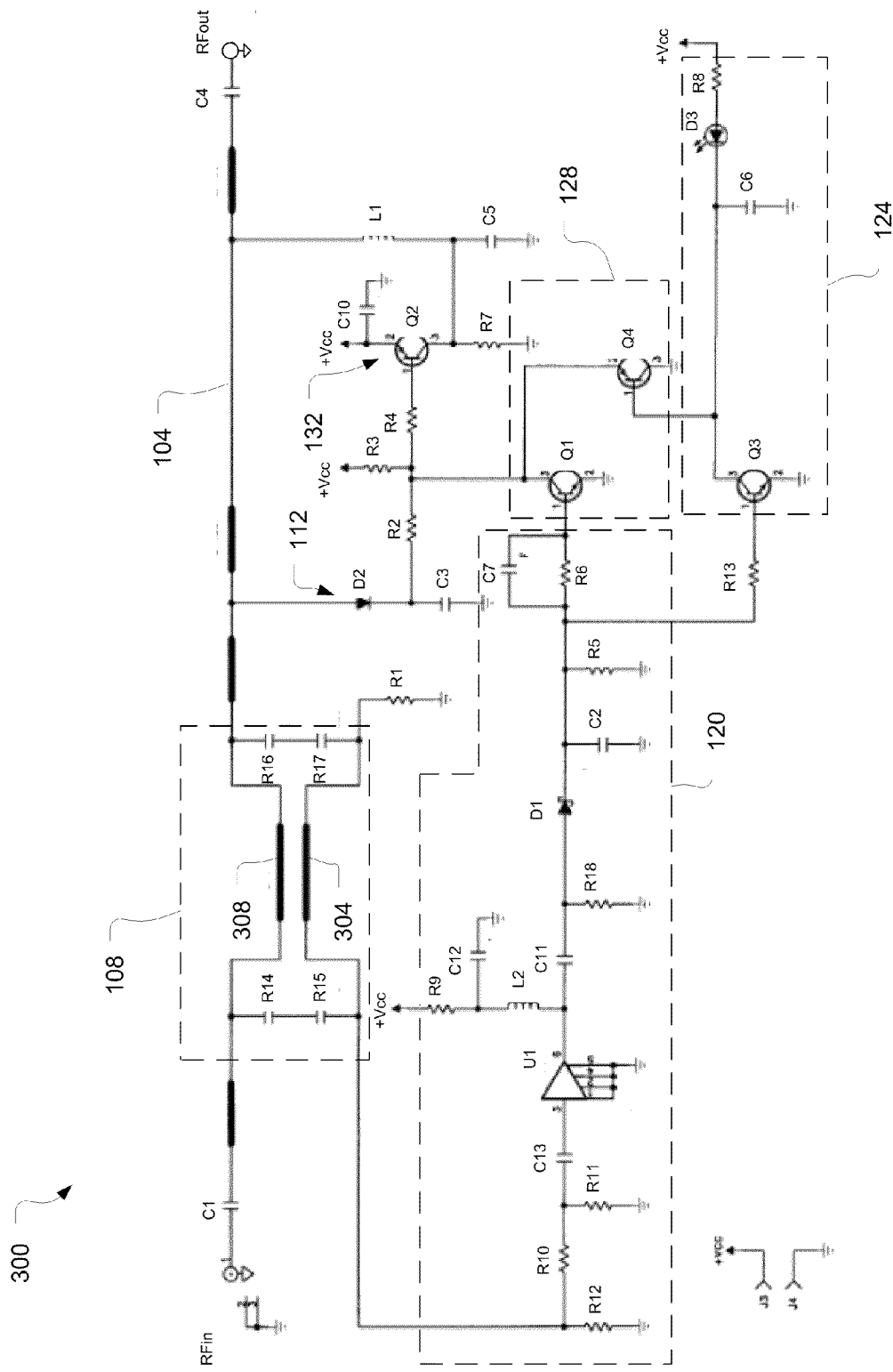
FIG. 3 is a circuit diagram of the input-power overload-protection circuit.

FIG. 3 is a circuit diagram 300 of the circuit 100 in accordance with some embodiments. General areas of the circuit diagram 300 that correspond to the elements described in FIG. 1 are labeled with similar reference numbers.

The coupler 108 may have a segment 304 configured to provide a broadband response in generating the derived RF signal as a result of the RFin signal through segment 308 of the coupler 108. The segments 304 and 308 may be quarter-wavelength microstrips and, in this embodiment, the coupler 108 may be referred to as a quarter-wavelength microstrip coupler. The coupler 108 may incorporate microwave design techniques directed towards achieving low insertion losses and high isolation. Directivity of the coupler 108 may be enhanced by using capacitors R14-R17 to provide capacitive compensation.

Inductive tuning sections, included in the coupler 108 and elsewhere on the transmission line 104, may compensate for parasitic capacitance associated with elements that are in shunt with the transmission line 104. Bypass capacitors C5 and C3 may be selected to cancel parasitic inductances, and a bias coil L1 may be selected to be resonance-free over the band of operation.

The derived RF signal may be attenuated and amplified by elements of the detector 120 including, e.g., amplifier U1 and attenuator R10, R11, and R12. The attenuator may be selected to adjust an overload threshold level corresponding to an overload condition. The threshold level may be set as a function of frequency or power level.

The detector 120 may include a Schottky diode D1; a resistor R18 to provide, e.g., a 50 ohm RF termination; and a capacitor C2 to provide an RF bypass. The Schottky diode D1 may drive a high-speed switch Q1, which may operate as a first input of the OR logic element 128. The Schottky diode D1 may drive Q1 via a resistor R6 and a speed-up capacitor C7. The speed-up capacitor C7 may accelerate provisioning of a leading edge of a signal from the Schottky diode D1 to the high-speed switch Q1.

The signal from the Schottky diode D1 will also drive elements of the timer 124, e.g., switch Q3, capacitor C6, and resistor R8. Switch Q3 may operate at a slower speed than the high-speed switch Q1; however, once activated it will stay activated for a time-constant determined by values of capacitor C6 and resistor R8. A light-emitting diode D3 may be used to provide a visible indication of a state of the timer 124. An output of the timer 124 may be provided to a switch Q4, which may be a second input of the OR logic element 128.

When the high-speed switch Q1 is turned off (e.g., when there is no overload condition) and the switch Q4 is turned off (e.g., when the timer 124 has expired), switch Q2 of the inverter 132 may be turned off. With the switch Q2 turned off, resistors R2 and R3 may set a voltage at a cathode of a PIN diode D2 of the control element 112 to be greater than a voltage at its anode. This may provide a reverse bias potential to the diode D2 that inhibits flow of current. The value of the reverse bias potential can be adjusted by, e.g., adjusting the values of Vcc, for desired pre-distortion linearization. In this manner, the protection module may provide a reverse bias potential across the PIN diode D2 to set the control element 112 to the non-attenuation state.

When either the high-speed switch Q1 is turned on (e.g., when there is an overload condition) or the switch Q4 is turned on (e.g., when the timer 124 is not expired), the switch Q2 will also be turned on. This will set the cathode voltage below the anode voltage, thereby flipping the bias on the PIN diode D2 from the reverse bias potential to a forward bias current. The forward bias current through the PIN diode D2 will result in a low impedance state that operates to reflect the high-power input wave back toward the source instead of being transmitted toward an output of the transmission line 104. In this manner, the protection module 116 may provide a forward bias current through the PIN diode D2 to set the control element 112 in the attenuation state.

In some embodiments, the control element 112 may include a field effect transistor (FET) rather than the PIN diode D2. In these embodiments, the control element 112 may be set to the attenuation state by the protection module 116 providing a forward bias potential at a gate of the FET.

In an implementation of the circuit diagram 300, it may be desirable to locate the diode D2 immediately adjacent to an output of the coupler 108. When the coupler 108 is a quarter-wavelength microstrip coupler, an input of the coupler 108 may be located approximately a quarter wavelength of a nominal frequency from the diode D2. This physical proximity of the diode D2 and the input of the coupler 108 may create a positive feedback mechanism in which the signal on the coupler 108 facilitates the diode D2 switching into the attenuation state.

While the circuit diagram 300 illustrates a particular arrangement of distinct circuit elements, it may be understood that various modifications may be implemented in various embodiments. For example, certain semiconductor devices, e.g., FETs, or devices associated with a given monolithic process may be substituted for other elements, such as the substitution of a FET for the PIN diode D2 discussed above. Also, while various passive devices are illustrated, in some embodiments active devices may be used when gain is desired. Also, depending upon the frequency, the circuit 100 may be realized with waveguides or conventional wires or printed circuit traces. It will be understood that many modifications and variations of the present invention are possible in light of the provided disclosure.

Figure 4:
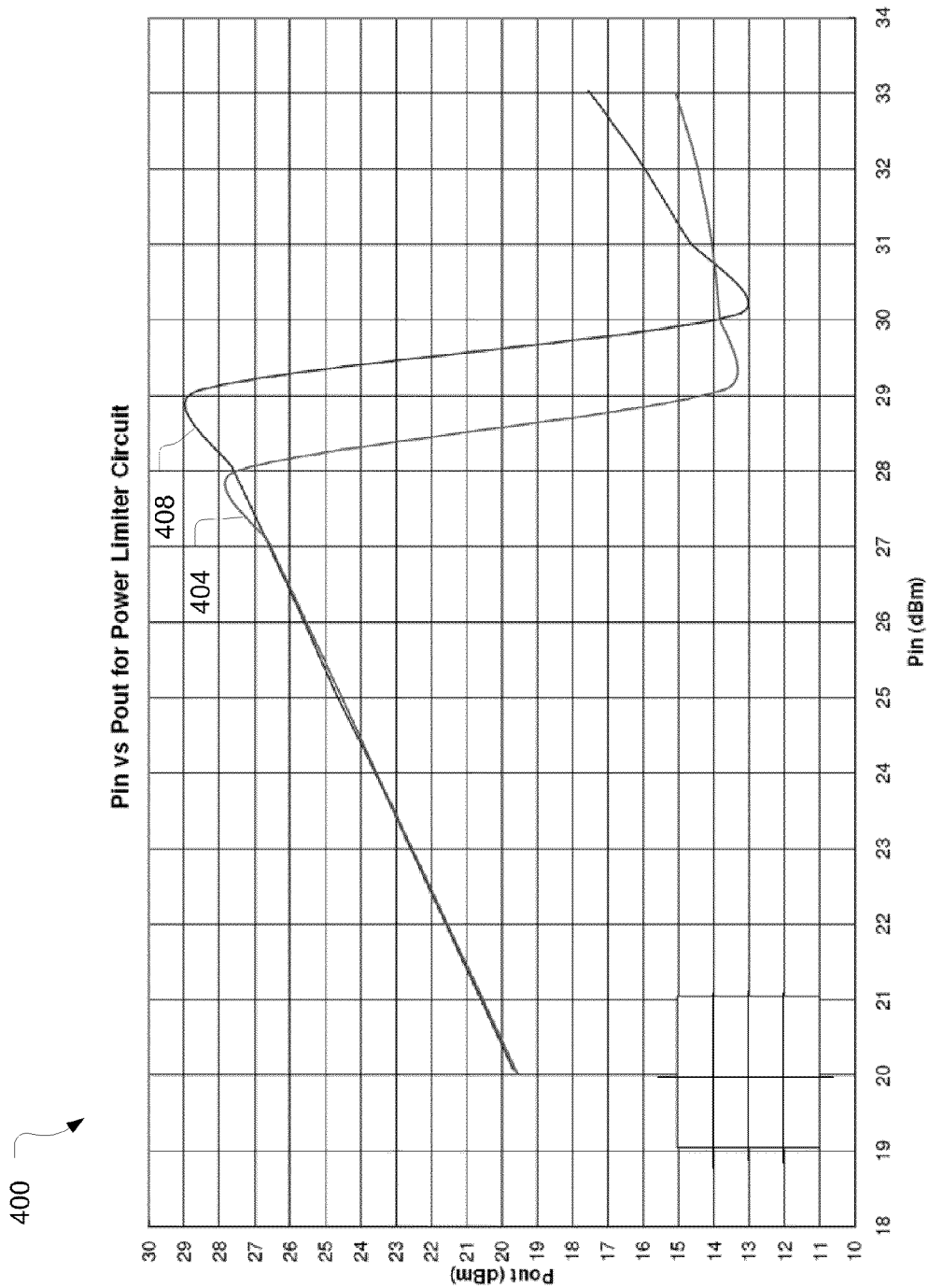

FIG. 4 is a graph 400 illustrating a ratio of power out (Pout) to power in (Pin) for two embodiments. Pout and Pin respectively correspond to dBm values of the RFout and RFin signals, where dBm represents a power ratio in decibels (dB) referenced to one milliwatt (mW). In these embodiments, a nominal frequency is 900 MegaHertz (MHz) with a 5 volt (V) Vcc bias. As can be seen for both embodiments, Pout tracks Pin up until an overload threshold for Pin is reached. At that point, the Pout signal may be significantly attenuated in order to avoid damage that may otherwise occur from an overload condition.

As mentioned above, the overload threshold level may be adjusted by using the attenuator R10-R12 to adjust the power input to the Schottky diode D1. As can be seen by graph 400, the overload threshold is set lower in the embodiment represented by line 404 than the embodiment represented by line 408.

Figure 5:
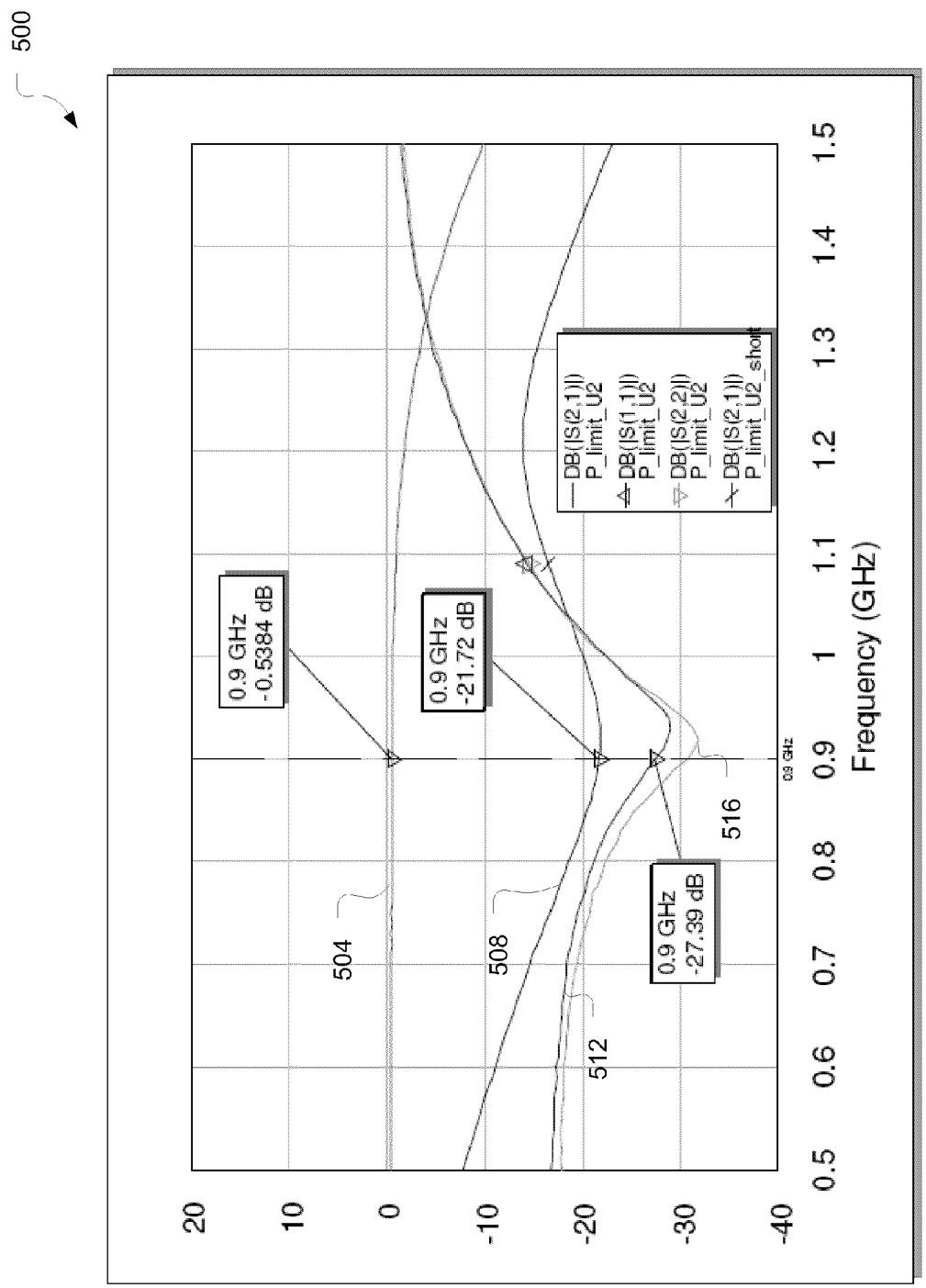
FIG. 5 is a graph illustrating scattering parameter performance.

FIG. 5 is a graph 500 illustrating scattering parameter (or "S-parameter") performance of the circuit 100 operating in accordance with some embodiments. In particular, the graph 500 illustrates insertion and return losses as functions of operating frequency for lines 504, 508, 512, and 516. In particular, line 504 provides the insertion loss for the circuit 100 operating with the control element 112 in a non-attenuation state; line 508 provides the insertion loss for the circuit 100 operating with the control element 112 in an attenuation state; and lines 512 and 516 respectively provide input and output return losses associated with the insertion loss of line 504. In this embodiment, isolation between the attenuation state and the non-attenuation state may be approximately 21 dB. See, e.g., the difference between 900 MHz isolation losses of lines 504 and 508. This isolation may be adjusted through selection of an appropriate capacitor value of C3 to resonate out parasitic inductances at a desired nominal frequency of a particular embodiment.

Figure 6:
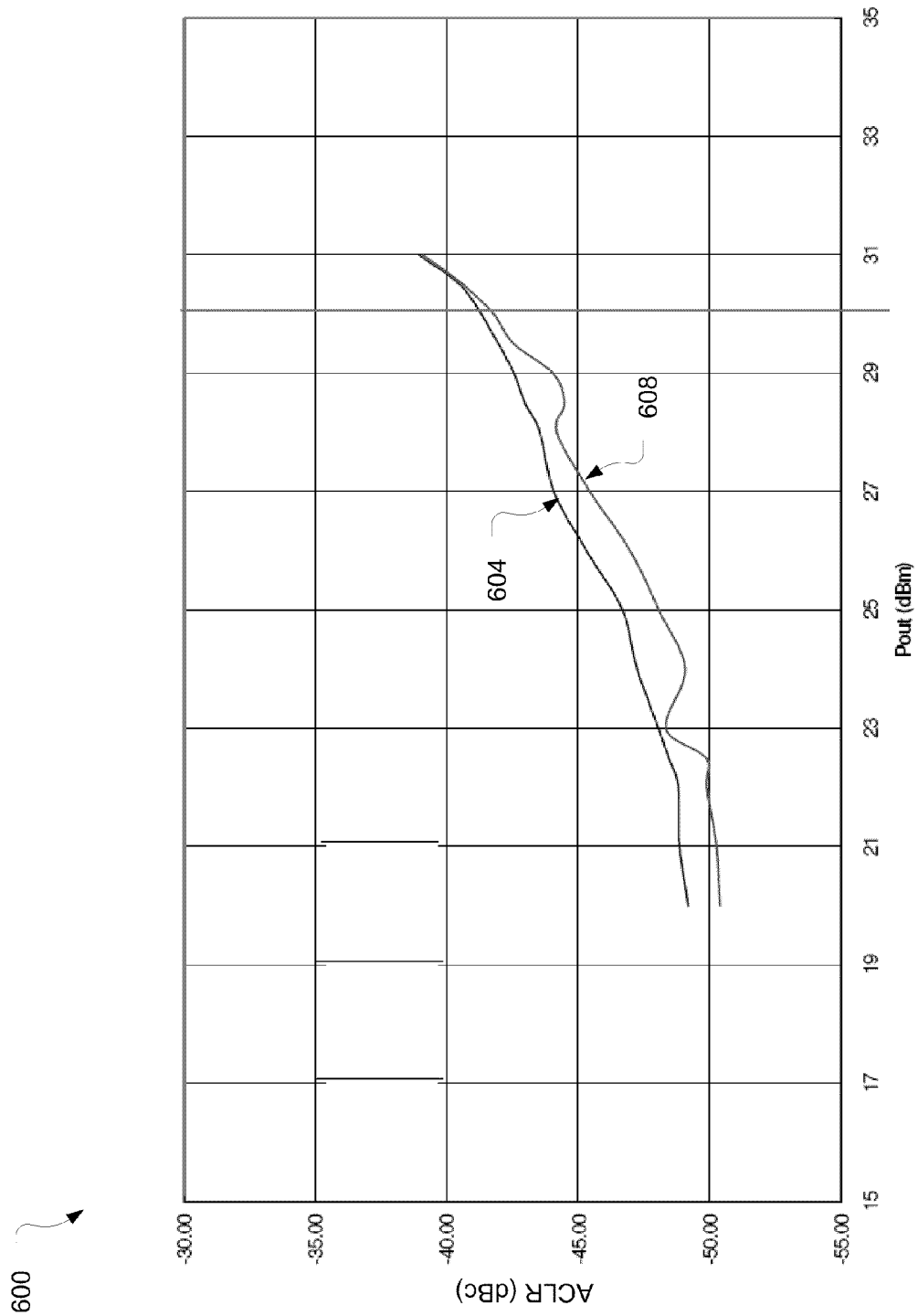
FIG. 6 is a graph illustrating comparative Adjacent Channel Leakage Ratio performance.

FIG. 6 is a graph 600 illustrating comparative Adjacent Channel Leakage Ratio (ACLR) performance of amplification circuitry that does not use the circuit 100, shown by line 604, and amplification circuitry that does use the circuit 100, shown by line 608, in accordance with some embodiments. An example of amplification circuitry that uses the circuit 100 may be seen in FIG. 7. The results charted in graph 600 may be the product of operating a power amplifier of the amplification circuitry with the following W-CDMA 3$^{rd}$ generation partnership project (3GPP) testing parameters: 1-64 dedicated physical channels (DPCH); a peak-to-average ratio (PAR) of 10.2 dB at 0.01% probability; and a 3.84 MHz bandwidth. These test parameters may hereinafter be referred to as "3GPP test parameters." The line 608 represents improved ACLR performance over line 604 due at least in part to the pre-distortion linearization provided by the control element 112.

Table 1 below provides a summary of measured performance of amplification circuitry with the circuit 100 in accordance with some embodiments.

TABLE 1

| Parameter | Values | Units |
| --- | --- | --- |
| Insertion Loss | 0.5 | dB |
| Isolation | 21 | dB |
| Input/Output Return Losses | 25 | |
| Input Power Handling | 33 | dBm |
| Switching Speed | 50 | Nanoseconds (nS) |
| Pre-distortion Improvement | 2 | dB |
| Supply Current (limiting) | 20 | Milliamps (mA) |

The 2 dB pre-distortion linearization improvement is an average improvement at a −50 dB relative to the carrier (dBc) ACLR level. Under 3GPP test parameters, the circuit 100 protected the power amplifier up to 15 dB past the power amplifier's 1 dB compression point (P1 dB).

Figure 7:
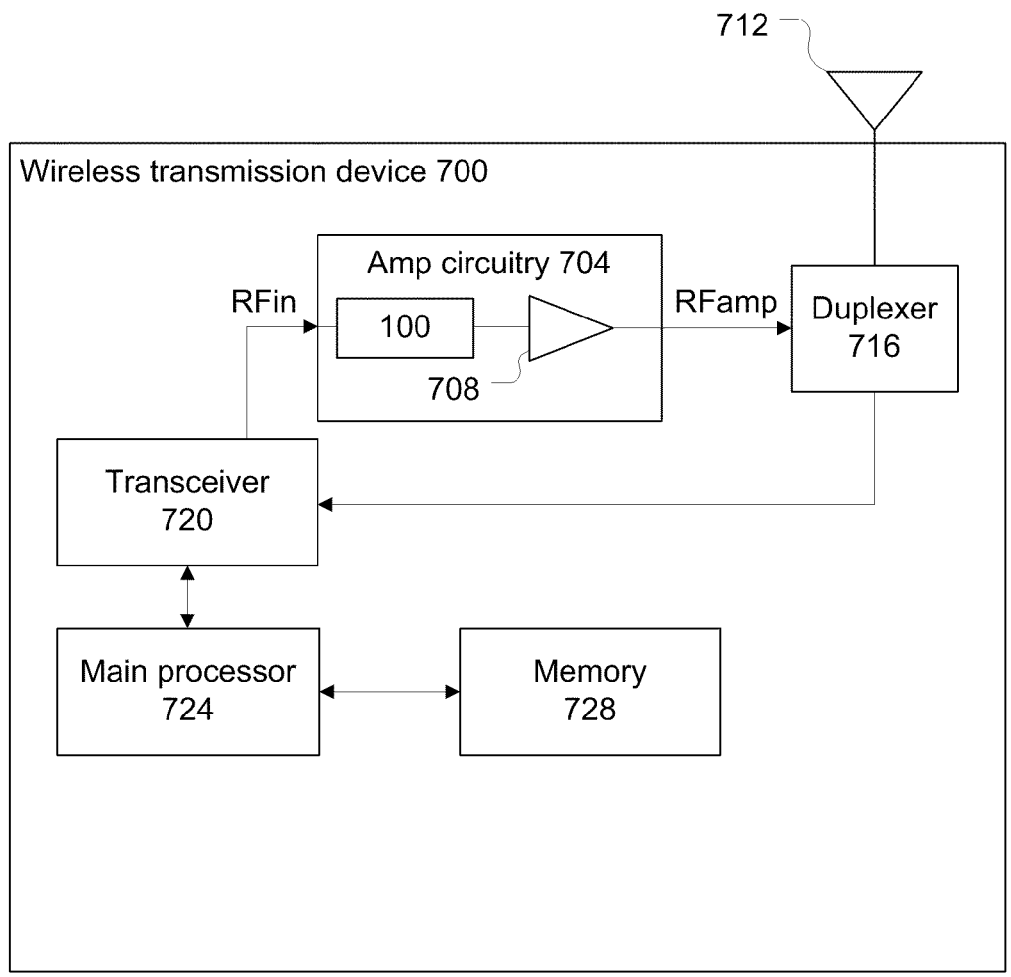
FIG. 7 illustrates a wireless transmission device implementing an input-power overload-protection circuit all in accordance with at least some embodiments.

The circuit 100 may be incorporated into any of a variety of apparatuses and systems. A block diagram of an exemplary wireless transmission device 700 incorporating the circuit 100 into amplification circuitry 704 with a power amplifier 708 is illustrated in FIG. 7. In addition to the amplification circuitry 704, the wireless transmission device 700 may have an antenna structure 712, a duplexer 716, a transceiver 720, a main processor 724, and a memory 728 coupled with each other at least as shown. While the wireless transmission device 700 is shown with transmitting and receiving capabilities, other embodiments may include wireless transmission devices without receiving capabilities.

In various embodiments, the wireless transmission device 700 may be, but is not limited to, a mobile telephone, a paging device, a personal digital assistant, a text-messaging device, a portable computer, a desktop computer, a telecommunications base station, a subscriber station, an access point, a radar, a satellite communication device, or any other device capable of wirelessly transmitting RF signals.

The main processor 724 may execute a basic operating system program, stored in the memory 728, in order to control the overall operation of the wireless transmission device 700. For example, the main processor 724 may control the reception of signals and the transmission of signals by transceiver 720. The main processor 724 may be capable of executing other processes and programs resident in the memory 728 and may move data into or out of memory 728, as desired by an executing process.

The transceiver 720 may receive outgoing data (e.g., voice data, web data, e-mail, signaling data, etc.) from the main processor 724, may generate the RFin signal to represent the outgoing data, and provide the RFin signal to the amplification circuitry 704.

The amplification circuitry 704 may amplify the RFin signal in accordance with a selected amplification mode. The amplified RFamp signal may be forwarded to the duplexer 716 and then to the antenna structure 712 for an over-the-air (OTA) transmission.

In a similar manner, the transceiver 720 may receive an incoming OTA signal from the antenna structure 712 through the duplexer 716. The transceiver 720 may process and send the incoming signal to the main processor 724 for further processing.

In various embodiments, the antenna structure 712 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless transmission device 700 is given by way of example and that, for simplicity and clarity, only so much of the construction and operation of the wireless transmission device 700 as is necessary for an understanding of the embodiments is shown and described. Various embodiments contemplate any suitable component or combination of components performing any suitable tasks in association with wireless transmission device 700, according to particular needs. Moreover, it is understood that the wireless transmission device 700 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
   a transmission line configured to transmit a radio frequency (RF) signal;
   a coupler coupled with the transmission line and configured to generate a derived RF signal that corresponds to the RF signal;
   a control element coupled with the transmission line and configured to transmit the RF signal while in a non-attenuation state and to reflect at least a portion of the RF signal while in an attenuation state; and
   a protection module coupled with the coupler and configured to switch the control element between the non-attenuation state and the attenuation state based at least in part on the derived RF signal.

2. The circuit of claim 1, wherein the control element comprises a diode.

3. The circuit of claim 2, wherein the protection module is configured to provide a forward bias current through the diode to set the control element in the attenuation state.

4. The circuit of claim 2, wherein the protection module is configured to provide a reverse bias potential across the diode to set the control element in the non-attenuation state.

5. The circuit of claim 1, wherein the protection module comprises a detector coupled with the coupler and configured to detect a condition in which the derived RF signal exceeds a predetermined threshold and the protection module is further configured to set the control element to the attenuation state based at least in part on a detection of the condition.

6. The circuit of claim 5, wherein the detector is configured to assert a first signal when the condition is detected and the protection module further comprises:
   a timer coupled with the detector and configured to assert a second signal for a predetermined amount of time after the first signal is asserted; and
   one or more logic elements coupled with the detector and the timer and configured to set the control element in the attenuation state when either the first signal or the second signal is asserted.

7. The circuit of claim 6, wherein the one or more logic elements comprise:
   an OR logic element having a first input coupled with the timer and a second input coupled with the detector; and
   an inverter coupled with an output of the OR logic element.

8. The circuit of claim 5, wherein the detector comprises an attenuator, an amplifier, and a Schottky diode.

9. The circuit of claim 1, wherein the control element is configured to provide pre-distortion linearization to the RF signal while in the non-attenuation state.

10. The circuit of claim 1, wherein the control element comprises a diode, the coupler is a quarter-wavelength microstrip, and the diode is located immediately adjacent to an output of the coupler and approximately a quarter wavelength, of a nominal frequency, from an input of the coupler.

11. A system comprising:
    a transceiver configured to provide a radio frequency signal and a control signal; and
    amplification circuitry coupled with the transceiver and including:
       a power amplifier configured to receive and amplify the radio frequency signal; and
       an input-power overload-protection circuit having a coupler coupled with the transmission line and configured to generate a derived RF signal that corresponds to the RF signal;
       a control element coupled with the transmission line and configured to transmit the RF signal while in a non-attenuation state and to reflect at least a portion of the RF signal while in an attenuation state; and
       a protection module coupled with the coupler and configured to switch the control element between the non-attenuation state and the attenuation state based at least in part on the derived RF signal.

12. The system of claim 11, wherein the control element consists of a diode or a field effect transistor.

13. The system of claim 11, wherein the control element is further configured to provide pre-distortion linearization to the RF signal while in the non-attenuation state.

14. The system of claim 11, wherein the control element comprises a diode, the coupler is a quarter-wavelength microstrip, and the diode is located immediately adjacent to an output of the coupler and approximately a quarter wavelength, of a nominal frequency, from an input of the coupler.

* * * * *